United States Patent
Noda et al.

(10) Patent No.: US 6,793,504 B2
(45) Date of Patent: Sep. 21, 2004

(54) LOW-PROFILE RECEPTACLE CONNECTOR

(75) Inventors: Atsuhito Noda, Hachioji (JP); Akinori Mizumura, Yamato (JP); Yoshihiro Tetsuka, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/060,736

(22) Filed: Jan. 30, 2002

(65) Prior Publication Data

US 2002/0111052 A1 Aug. 15, 2002

(30) Foreign Application Priority Data

Jan. 31, 2001 (JP) ........................................ 2001-023782

(51) Int. Cl.[7] .............................................. H01R 12/00
(52) U.S. Cl. ........................ 439/71; 439/591; 439/862
(58) Field of Search ................................ 439/71, 74, 66, 439/722, 591, 862

(56) References Cited

U.S. PATENT DOCUMENTS

| | | | | |
|---|---|---|---|---|
| 4,199,209 | A | * | 4/1980 | Cherian et al. ............. 439/515 |
| 4,341,433 | A | * | 7/1982 | Cherian et al. ............. 439/331 |
| 5,427,535 | A | * | 6/1995 | Sinclair ....................... 439/66 |
| 5,938,451 | A | * | 8/1999 | Rathburn ..................... 439/66 |
| 6,042,389 | A | | 3/2000 | Lemke et al. ................ 439/74 |
| 6,045,416 | A | | 4/2000 | Sinclair ....................... 439/857 |
| 6,106,305 | A | * | 8/2000 | Kozel et al. ................. 439/66 |
| 6,178,629 | B1 | * | 1/2001 | Rathburn ..................... 29/830 |
| 6,193,537 | B1 | | 2/2001 | Harper, Jr. et al. ......... 439/291 |
| 6,409,521 | B1 | * | 6/2002 | Rathburn ..................... 439/66 |

OTHER PUBLICATIONS

U.S. patent application Ser. No. 10/372,865, Noda et al., filed Feb. 24, 2003.
International Search Report, Specification, Claims and Abstract.

* cited by examiner

Primary Examiner—Gary Paumen
Assistant Examiner—Edwin A. Leon
(74) Attorney, Agent, or Firm—Thomas D. Paulius

(57) ABSTRACT

A low-profile receptacle connector for use in making a required electric connection between an integrated circuit package and a printed circuit board includes a terminal housing part that is sandwiched between the integrated circuit package and the printed circuit board, and the terminal housing part has terminals embedded therein. Each terminal includes a flat trunk and at least one cantilever-like contact arm integrally connected to its flat trunk. The terminals are arranged with their flat trunks parallel to the plane of the terminal housing part, and are supported by the terminal housing part by allowing the mold to overhang the opposite lateral and longitudinal edges of the trunk of each terminal.

18 Claims, 5 Drawing Sheets

PRIOR ART

LOW-PROFILE RECEPTACLE CONNECTOR

BACKGROUND OF THE INVENTION

The present invention relates generally to receptacle connectors, and more particularly, to receptacle connectors that are used to make connections between an integrated circuit ("IC") package having numerous contacts, such as a BGA or LGA contacts, and a printed circuit board having numerous contacts pads formed thereon.

FIG. 7 illustrates a conventional connector having numerous terminals 300 embedded in its insulative housing 301. In use, the housing 301 is sandwiched between an IC package (not shown) and a printed circuit board 302. Each terminal 300 of the connector typically includes a contact arm 304 that is applied against a selected contact pad 303 of the circuit board 302, and a contact 305 integrally formed to the contact arm 304 for touching a selected counter contact, typically a spherical or land-shaped contact of the IC package. The connector housing 301 has retainers 306 formed therein which hold terminals 300 in the housing 301 in such a way that each contact 305 is resilient enough to yieldingly move, or sink, when applied to the counter contact.

The presence of these retainers 306 formed in, or as part of the terminal housing 301 prevents the reduction of the connector housing thickness. The conventional receptacle connector of FIG. 7, therefore, is too thick to be used in personal computers, which have been getting smaller and thinner. Also disadvantageously, the conventional receptacle connector allows its contact arm ends to be stained with flux in soldering to conductor pads 303. Also, soldering material is allowed to attach to its contact arm ends in the form of whiskers.

The present invention is directed to an improved receptacle connector that overcomes the aforementioned disadvantages.

SUMMARY OF THE INVENTION

Accordingly, it is a general object of the present invention is to provide a receptacle connector having a reduced thickness.

Another object of the present invention is to provide a low-profile receptacle connector for BGA or LGA applications, the connector including a thin housing in the form of a socket, the socket having a plurality of cavities formed therein, a plurality of terminals disposed in the cavities, each of the terminals having a flat terminal body portion with at least two opposing edges, the terminal including a terminal retention arm extending in one direction from one of the two terminal body portion edges and a terminal retention stub extending in a second direction from the other of the two terminal body portion edges, the terminal flat body portion having shape that permits it to be held in place within a molding cavity such that molding material from which the connector housing is formed may flow around the terminal retention arm and stub to retain the terminal in place within the connector housing, thereby eliminating the need for forming terminal retainers in the connector housing associated with each connector housing cavity.

A further object of the present invention is to provide a terminal for use in reduced-height connector housings, and the terminal including a flat body portion, the body portion having at least two opposing edges, a retention arm extending away from the terminal body portion in one direction and along one of the two edges thereof, a retention stub extending away from the body portion in a second direction and along the other of the two edges thereof, and a contact arm extending away from the terminal body portion in a cantilevered fashion for making contact with an opposing contact pad on a circuit member to which the connector housing is mounted.

A still further object of the present invention is to provide a terminal as described above, but with the terminal having two retention stubs at two opposing ends of the terminal body portion, each of the retention stubs extending into the connector housing and serving to retain the terminal in place within the connector housing, the terminal having a pair of contact arms extending away from the terminal body portion in a cantilevered fashion for making contact with opposing contact pads on circuit members flanking the connector housing.

To attain these and other objects, the present invention provides a receptacle connector for connecting an IC package with numerous contacts such as a BGA or LGA type contacts to a circuit board having numerous contact pads disposed thereon, the connector including an insulative housing interposed between the IC package and the circuit board, the housing having a plurality of terminals embedded therein for making connections between the IC package contacts and the contact pads of the circuit board. This structure is improved by forming the terminals in a desired manner such that each terminal includes comprises a flat trunk, or body portion and at least one cantilever-like contact arm integrally connected to the flat body. The terminals are preferably arranged in the connector housing with their flat bodies parallel to a plane of the terminal housing, and are preferably supported by the terminal housing in a manner so that the molded portions of the housing overhangs the opposite longitudinal and lateral edges of the terminal flat bodies.

The terminals may take one or two embodiments. In one embodiment, a retention arm extends upwardly from the plane of the terminal body portion at an angle thereto, and a retention stub extends away from the terminal body portion in the same plane as the body portion. Both the retention arm and the retention stub are held in place within a molding cavity so that the connector housing material may be molded around them to anchor the terminals in place within the connector housing. In this embodiment, the flat body portion is exposed on one side of the connector housing cavity that communicates with the terminal, so that an element, such as a solder ball may be attached thereto.

In another embodiment of the invention, two retention stubs extend in the same plane as the terminal body portion and extend away therefrom. The terminal is bent upon itself to form the retention stubs so as to define a cantilevered contact arm that extends away from the terminal at the flat body portion and at the portion where the terminal is retained in the connector housing, and in this second embodiment of the invention, two such cantilevered contact arms are thereby defined that extend from the terminal in opposite directions so that the connector using such terminals may be interspersed between two circuit members, or circuit boards.

With this arrangement, the connector terminals are firmly held in place by molded portions of the connector housing, thereby eliminating the forming of such retainers as in conventional receptacle connectors. Thus, the thickness of the receptacle connector can be reduced. This structure also advantageously prevents the staining, or contamination, of the terminals and their contacts with soldering flux. It also prevents the attachment of hairs, whiskers or strands of solder from adhering to the terminal contacts.

In the area where the cantilevered contact arms are formed, each terminal may have a "U"-shaped joint formed at its body-to-contact arm transition area where the terminal is bent upon itself, and the molded connector housing overlies these "U"-shaped joints to retain the terminals in place. The body portion of the terminal may also serve as a contact by supporting a selected spherical contact of the IC package, such as a solder ball, and permitting it to be applied to the center of the terminal body portion. Each terminal may have two cantilever-like contact arms integrally connected to the opposite lateral edges of the trunk.

These and other objects, features and advantages of the present invention will be clearly understood through a consideration of the following detailed description.

BRIEF DESCRIPTION OF THE DRAWINGS

Other objects and advantages of the present invention will be understood from the following description of connectors according to the preferred embodiments of the present invention, which are shown in accompanying drawings, in which.

DETAILED DESCRIPTION OF THE PREFERRED EMBODIMENTS

Figure 1:
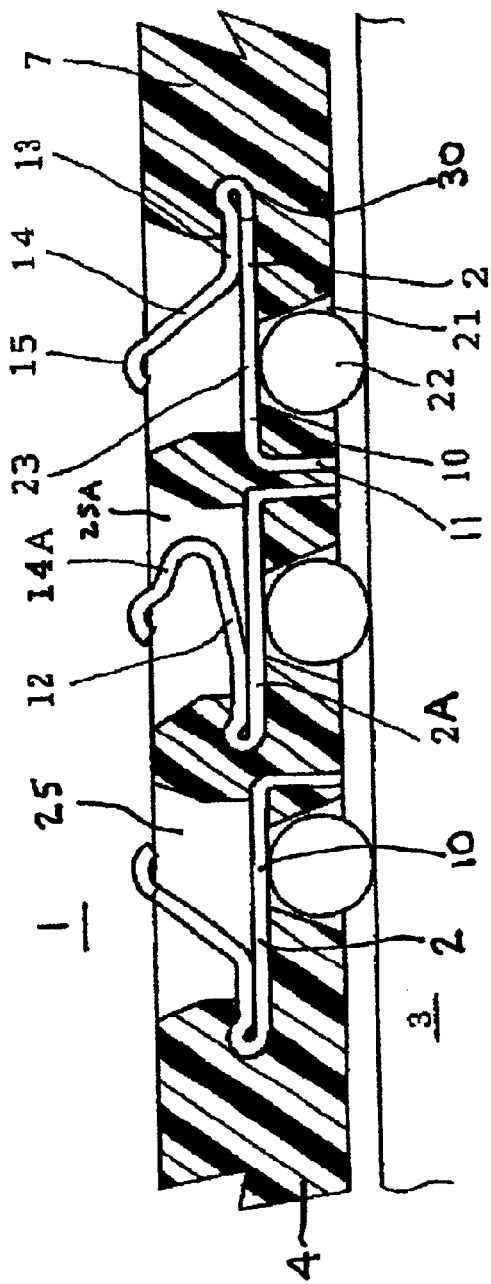
FIG. 1 is an enlarged sectional view of a first embodiment of a receptacle connector constructed in accordance with the principles of the present invention.
Figure 2:
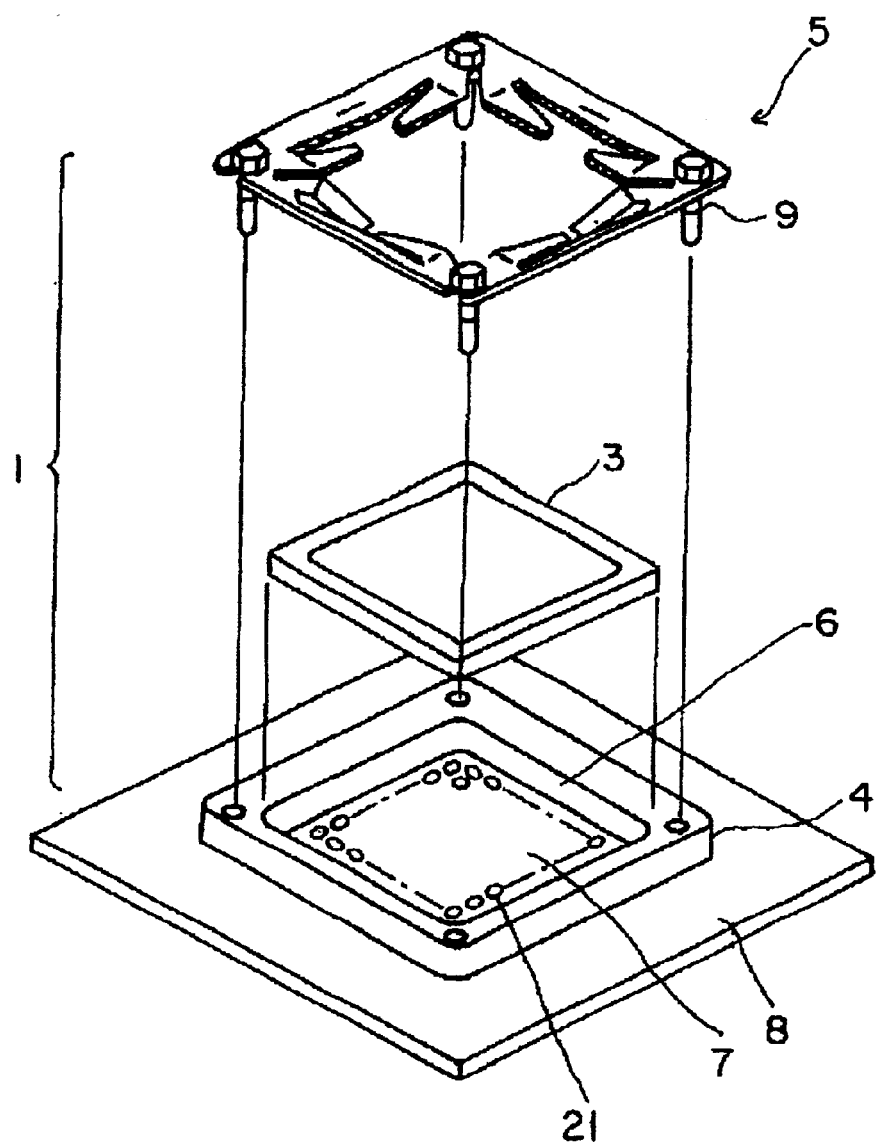
FIG. 2 is an exploded view of the receptacle connector of FIG. 1.

Referring first to FIGS. 1 and 2, a receptacle connector assembly constructed in accordance with the principles of the present invention is illustrated generally at 1. The connector is used in making electrical connections between an IC package such as a BGA or LGA type of IC package and a circuit board 8. The connector includes an insulative, molded housing 4, formed as a receptacle for receiving an IC package 3 and a resilient cover 5. A series of conductive terminals 2 are arranged in the form of lattice, and are embedded in the bottom 7 of the package-containing space of the housing 4. The receptacle housing 4 is laid on the printed circuit board 8, and the integrated circuit package 3 is put in the square space 6 of the receptacle housing 4. Finally, a resilient cover 5 may be laid on the integrated circuit package 3 to be fixed with screws 9. The receptacle housing 4 is preferably molded from an insulating material, such as a plastic or a dielectric material, while the resilient cover 5 is preferably formed, such as by stamping it, from a thin sheet of metal.

Figure 3:
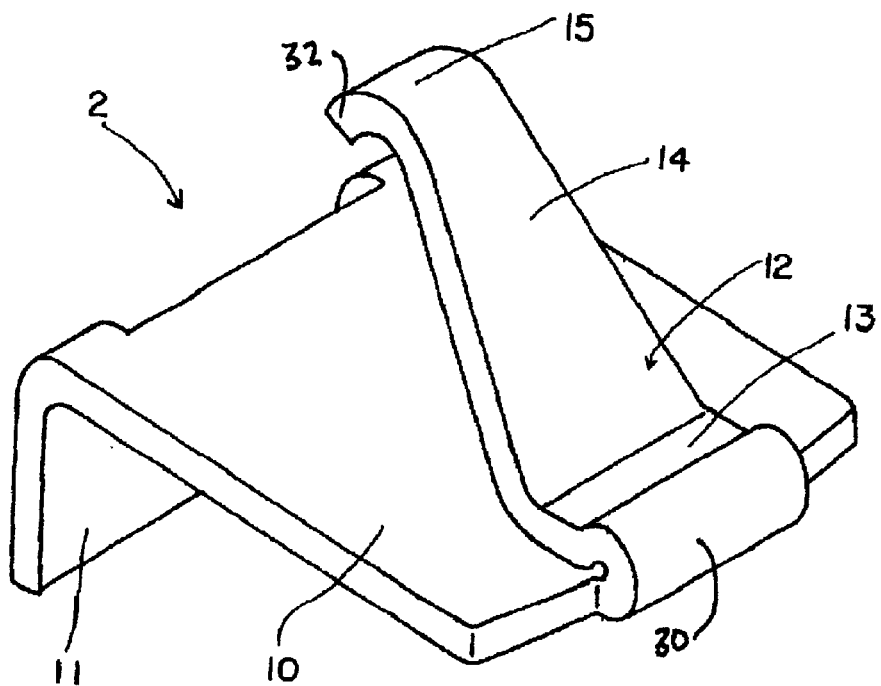
FIG. 3 is a perspective view of a terminal used in the connector of FIG. 1 and of the present invention.

The conductive terminals 2 of the connector assembly 1 are also preferably stamped out of a sheet of metal. As shown in FIG. 3, the terminal 2 preferably includes a flat trunk, or body portion 10, having an extension portion that takes the form of an arm 11, that is formed on one lateral edge of the body portion 10, with the extension arm extending away from the body portion in one direction, either "upwardly" or "downwardly" from the flat body portion 10, depending on the orientation of the connector. Each such terminal 2 further includes a cantilever-like contact arm 14 that extends away from, and preferably obliquely from the other, or opposite, lateral edge of the body portion 10 and a retention stub 13 of the terminal, and preferably from a U-shaped bend or joint 13. This retention stub 13 preferably extends generally parallel to the flat surface of the body portion 10 and generally along the same plane as the flat body portion 10, although this coplanarity is not required. The retention stub 13 extends in a horizontal plane, while the retention arm 11 extends in a vertical plane. The cantilever-like contact arm 14 preferably terminates in a free end 32 that includes an inwardly curved contact end 15.

Such terminals 2 are housed in recesses, or cavities 6, that are formed on the bottom of the receptacle housing 4 in the form of lattice, or other suitable arrangement. Each terminal 2 is housed in a selected recess 6 with its flat body portion 10 laid on the bottom of the receptacle housing recess, and the longitudinal and lateral opposite edges of the flat body portion 10, namely retention arm 11 and the U-shaped retention stub 13 to be embedded in a mold for the receptacle connector. Thus, with elements 11 and 13 extending into the area that is covered with the housing molding material, the terminals 2 are firmly held in the housing mold, while still retaining a good resilience in its protruding cantilevered contact arm 14.

Figure 4:
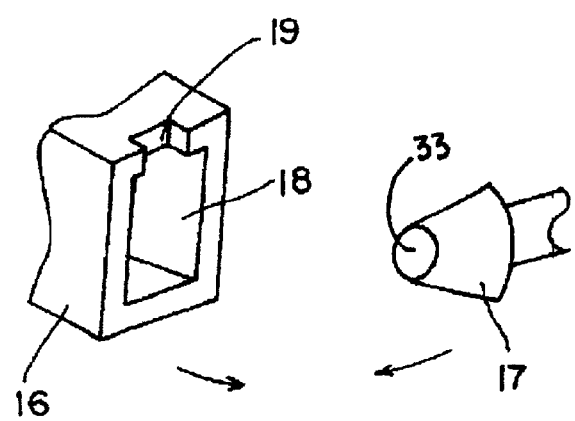
FIG. 4 is a perspective view of paired molds that are used in molding the housing of the receptacle connector of FIG. 1.

More specifically, each terminal 2 of the type illustrated in FIG. 1 is preferably sandwiched between the first and second mold sections 16 and 17 illustrated in FIG. 4 during molding of the receptacle connector housing 4. As seen from FIG. 4, in the first mold section 16, a plurality of cavities 18 may be formed for accommodating the upper side of the terminal shown in FIG. 3, namely the side of the terminal from which the cantilevered contact arm 14 extends. A rectangular notch 19 is formed adjacent the cavity 18 for receiving the retention stub 13 of the terminal 2, and particularly the U-shaped joint 30 thereof. The cavity 18 receives the cantilevered contact arm 14. The second mold section 17 takes the shape of frustum of a cone, thereby permitting its top, and preferably its flat head 33 to be applied closely to the center of the mold cavity, and within part of the first mold section 16 so that the head 33 will lie adjacent to the flat body portion 10 in the area in the housing that accommodates the terminal flat body portion 10.

Figure 5:
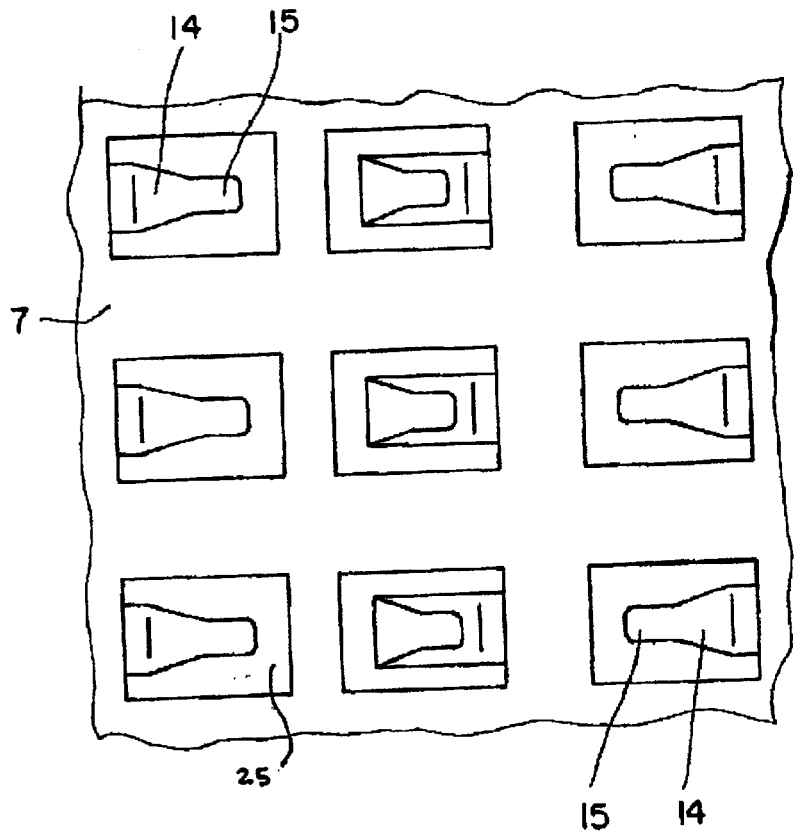
FIG. 5 is an enlarged bottom plan view of a section of the receptacle connector of FIG. 1.

Referring now to FIGS. 1 and 5, and particularly FIG. 5, it can be seen that the contact ends 15 of the cantilevered contact arms 14 appear on the bottom of the receptacle housing 4 in a pattern taking the form of a lattice, thus permitting the contact ends 15 to contact opposing contact pads of the circuit board 8 in a one-to-one confronting relation. Each one of the terminals is disposed within a single cavity 25 of the receptacle connector housing.

Referring to FIG. 1 again, the receptacle housing 4 has numerous holes, or cavities 21, that are formed on and communicate with the IC package accommodating space 6. These cavities 21 are made by inserting the second mold sections 17 (the frustum of a cone) as a first step of molding. Then, the terminals 2 are laid in place within the mold cavity and in contact with the first mold sections so that their flat body portions 10 contact the heads 33 of the second mold sections. In this manner, the contact between the two will ensure that the terminal flat body portions 10 are partially exposed in the receptacle connector housing 4. The first mold sections 16 are then put into place in the mold cavity and over the terminals 2, thereby securing them in place within the mold. Housing material is then injected into the mold cavity and around the first and second mold sections and the retention members are thus firmly embedded in the connector housing. The receptacle connector assembly 1 thus provided permits its exposed flat body portions 10, 23 to be placed into contact with the spherical contacts, shown as solder balls 22, of the printed circuit board 8. The solder balls 23 and the contact arms 14 extend out of and past the exterior surfaces on the connector housing in opposite directions.

As may be understood from the above, all the terminals 2 are arranged with their flat body portions 10, 23 parallel to the opposing major surfaces of the receptacle housing 4, and their retention arms and stubs at the lateral edges 11, 13 are embedded in the mold. Thus, the distance between the IC package 3 and the circuit board 8, and hence the profile of the receptacle connector assembly 1 can be reduced to possible minimum. Moreover, each terminal is free of being stained with soldering flux or free of solder being attached in the form of whiskers or strands, thanks to the "U"-shaped joint being embedded in the mold.

In FIG. 1, the cantilevered contact arm 14A of the center terminal 2A is different in shape from those of the other terminals 2. This terminal 2A is yieldingly bent to be flat when being pushed by the mold sections 16, 17 and removal of the two mold sections will allow the terminal 2 to return to its stress-free initial shape.

Figure 6:
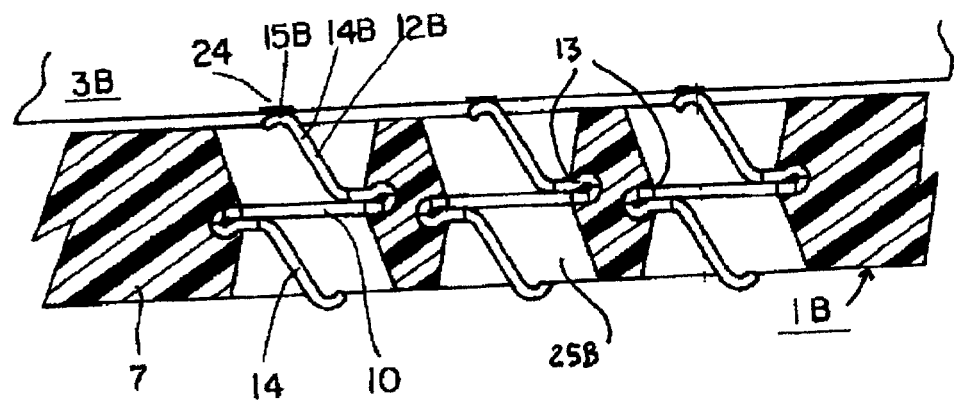
FIG. 6 is an enlarged longitudinal section of a second embodiment of a receptacle connector constructed in accordance with the principles of the present invention; and, FIG. 7 is an enlarged sectional view of a portion of a conventional receptacle connector.
Figure 7:
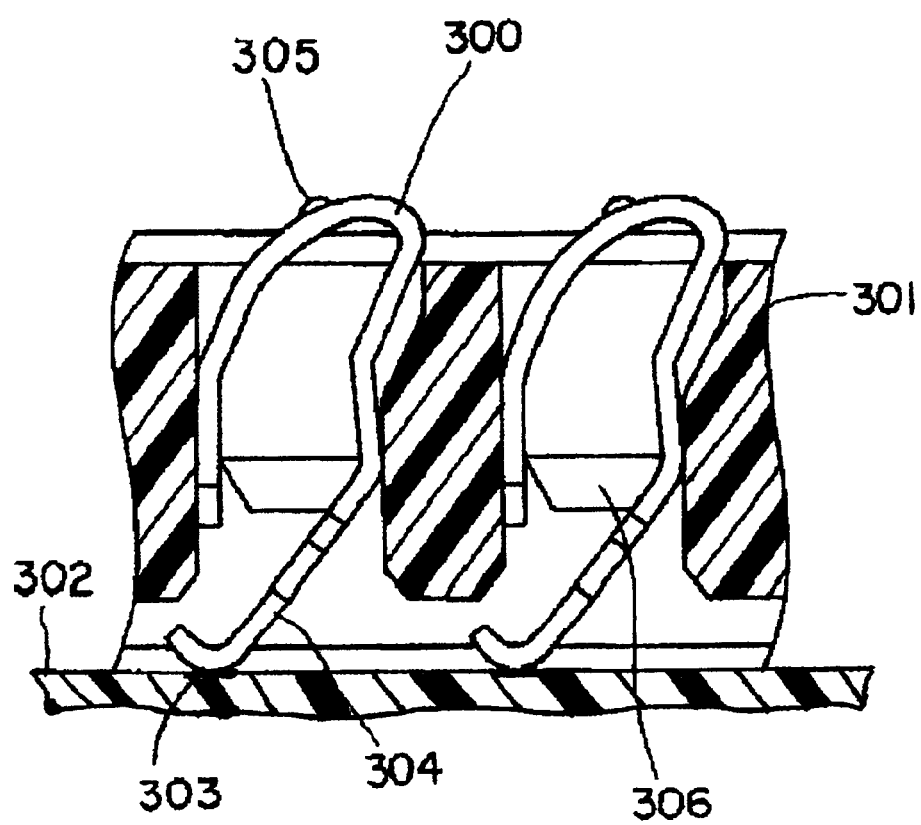

Referring now to FIG. 6, a second embodiment of a receptacle connector 1B constructed in accordance with the principles of the present invention is illustrated and utilizes terminals, each terminal has two cantilever-like contact arms 14 and 14B that are connected to, and preferably integrally formed with the opposite lateral edges of the flat body portion 10, meaning that they project from the flat body portions 10 and define thereat, two opposing retention stubs 13. The retention stubs 13 extend in horizontal planes, but in different directions, the free ends of the contact arms 14, 14B extend out of the connector housing and past the exterior surfaces thereof. In this particular embodiment, the receptacle connector 1B has an additional lattice-like arrangement of contacts 15B that extend on both sides of the connector so that they may confront an overlying IC package 3B and make contact with contact pads 24 thereof such as a land-grid type of IC package when fitted in the space 6 of the receptacle connector housing 4.

While the preferred embodiment of the invention have been shown and described, it will be apparent to those skilled in the art that changes and modifications may be made therein without departing from the spirit of the invention, the scope of which is defined by the appended claims.

What is claimed is:

1. A receptacle connector for effecting an electrical connection between an integrated circuit package having a plurality of contacts disposed thereon, and a printed circuit board having a plurality of contact pads formed thereon, the receptacle connector comprising:

an insulative connector housing for interposing between the integrated circuit package and the printed circuit board in use, the connector housing being formed from a plastic and including a plurality of cavities formed therein, each of the cavities opening to opposite surfaces of said connector housing; and, a plurality of conductive terminals embedded in said connector housing, each of the terminals being disposed in a single one of said cavities, the terminals including body portions extending across connector housing cavities, the terminal body portions having a plurality of edges, said terminals including pairs of terminal retention members disposed along two opposing edges of said body portions, the terminal retention members being molded into said connector housing to thereby hold said terminals in place, at least one of said terminal retention member including a retention stub formed by bending said terminal upon itself, said terminals further including contact arms that extend away from said terminal body portions and project exterior of said connector housing for contacting said contacts or contact pads.

2. The receptacle connector of claim 1, wherein a portion of each said terminal is folded upon itself to define a U-shaped bend in said terminal, the U-bend defining said terminal retention stub of said terminal.

3. The receptacle connector according to claim 1, wherein each of said contact arms extends obliquely away from said body portion, beginning at said retention stub and terminating in a free end that is spaced apart from a central portion of said body portion.

4. The receptacle connector according to claim 1, wherein each of said terminals includes a retention stub as one of its retention members and further includes a retention arm as the other of its said two retention members, said retention stub and arm extending away from said terminal body portion in different directions.

5. The receptacle connector of claim 4, wherein said terminal body portions of said terminals extend in a horizontal plane within said connector housing cavity and said terminal retention arms extend in a vertical plane away from said terminal body portions and said retention stubs extend away from said terminal body portions in a horizontal plane.

6. The receptacle connector of claim 5, wherein said terminal retention arms and stubs of said retention members are molded into said connector housing.

7. The receptacle connector according to claim 5, wherein said terminal retention arms and stubs are disposed perpendicular to each other.

8. A The receptacle connector according to claim 1, wherein each of said terminals includes a spherical contact applied to said terminal and disposed on a side thereof opposite said contact arm.

9. The receptacle connector according to claim 8, wherein said spherical contact includes a solder ball and a portion of the solder ball extends past an adjacent surface of said connector housing and said contact arm extends past an opposite surface of said connector housing.

10. The receptacle connector according to claim 1, wherein each of said retention members includes a retention stub and said two retention stubs extend away from said terminal body portion in different directions.

11. The receptacle connector according to claim 10, wherein said terminal body portion extends in a horizontal plane and each of said retention stubs extend away from said terminal body portion in horizontal planes.

12. A connector for connecting together an integrated circuit package having a plurality of contacts disposed thereon, and a printed circuit board having a plurality of contact pads formed thereon, the connector comprising:

an insulative housing having a plurality of sidewalls that cooperatively define a receptacle of said connector for receiving the integrated circuit package, the connector housing including a plurality of terminal-receiving cavities formed therein and arranged within the receptacle, each of the terminal-receiving cavities opening to opposite surfaces of said housing; and, a plurality of conductive terminals disposed in said terminal-receiving cavities, a single one of the terminals being disposed in a single cavity, each of the terminals including a terminal body portion extending horizontally within its associated terminal-receiving cavity, the terminal body portion having a plurality of edges, two terminal retention members disposed along two opposing edges of said body portion and a contact arm that extend away from said terminal body portion and projecting exterior of said connector housing, the two terminal retention members being embedded in said housing to thereby hold said terminal in place within said housing and in said terminal-receiving cavity, at least one of said terminal retention members including a retention stub formed by bending said terminal upon itself at one of said two opposing edges of terminal body portion, each of said terminal body portions extending horizontally within said terminal-receiving cavities, said terminal retention arms extending vertically away from said terminal body portions and said terminal retention stubs extending horizontally away from said terminal body portions.

13. The connector according to claim 12, wherein each of said terminals further includes a retention arm as the other of its said two retention members, said retention stub and arm extending away from said terminal body portion in different directions.

14. The receptacle connector of claim 12, wherein a portion of each said terminal is folded upon itself to define a U-shaped bend in said terminal, the U-bend defining said terminal retention stub.

15. The receptacle connector according to claim 12, wherein each of said terminals includes a spherical contact applied to said terminal and disposed on a side thereof opposite said contact arm.

16. The receptacle connector according to claim 12, wherein said retention members include two retention stubs that extend away from said terminal body portion in different directions.

17. The receptacle connector according to claim 16, wherein said terminal body portion extends in a horizontal plane and each of said retention stubs extend away from said terminal body portion in horizontal planes.

18. A receptacle connector for effecting an electrical connection between an integrated circuit package having a plurality of contacts disposed thereon, and a printed circuit board having a plurality of contact pads formed thereon, the receptacle connector comprising:

an insulative connector housing for interposing between the integrated circuit package and the printed circuit board in use, the connector housing including a plurality of cavities formed therein, each of the cavities opening to opposite surfaces of said connector housing; and, a plurality of conductive terminals embedded in said connector housing, each of the terminals being disposed in a single one of said cavities, the terminals including body portions extending across connector housing cavities, the terminal body portions having a plurality of edges, said terminals including pairs of terminal retention members disposed along two opposing edges of said body portions, the terminal retention members extending into said connector housing to thereby hold said terminals in place, at least one of said terminal retention member including a retention stub formed by bending said terminal upon itself, said terminals further including contact arms that extend away from said terminal body portions and project exterior of said connector housing for contacting said contacts or contact pads, each of said terminals including a spherical contact applied to said terminal and disposed on a side thereof opposite said contact arm.

* * * * *